(12) United States Patent
Starkston et al.

(10) Patent No.: US 10,125,013 B2
(45) Date of Patent: Nov. 13, 2018

(54) MICROELECTROMECHANICAL SYSTEM WITH SPRING FOR MAGNET PLACEMENT

(71) Applicant: Intel Corporation, Santa Clara, CA (US)

(72) Inventors: Robert Starkston, Phoenix, AZ (US); Amanuel M. Abebaw, Chandler, AZ (US); Liwei Wang, Phoenix, AZ (US); Mark Saltas, Chandler, AZ (US); Sandeep S. Iyer, Chandler, AZ (US); Nick Labanok, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/354,761

(22) Filed: Nov. 17, 2016

(65) Prior Publication Data

US 2018/0134547 A1 May 17, 2018

(51) Int. Cl.
*B81B 3/00* (2006.01)
*B81C 1/00* (2006.01)
(Continued)

(52) U.S. Cl.
CPC .......... *B81C 1/00182* (2013.01); *B29C 65/14* (2013.01); *B29C 65/4805* (2013.01); *B81B 3/0032* (2013.01); *B81B 3/0051* (2013.01); *B81B 3/0054* (2013.01); *B81B 3/0059* (2013.01); *B81B 3/0062* (2013.01);
(Continued)

(58) Field of Classification Search
CPC ... B81B 3/0051; B81B 3/0054; B81B 3/0056; B81B 3/0059; B81B 3/0062; B81B 3/0097; B81B 2203/0163
See application file for complete search history.

(56) References Cited

U.S. PATENT DOCUMENTS 8,752,969 B1 6/2014 Kane et al.
9,083,873 B1 * 7/2015 Lewkow ............... G02B 7/021
(Continued)

OTHER PUBLICATIONS

International Search Report and Written Opinion dated Jan. 31, 2018 for International Application No. PCT/US2017/056983, 12 pages.

*Primary Examiner* — Daniel Luke
(74) *Attorney, Agent, or Firm* — Schwabe, Williamson & Wyatt, P.C.

(57) ABSTRACT

Apparatuses, systems, and methods associated with placement of magnets within a microelectromechanical system device are disclosed herein. In embodiments, a method of affixing at least one magnet in a microelectromechanical system, may include affixing an electromagnetic actuator to a base structure of the microelectromechanical system, the affixing including affixing the electromagnetic actuator within a recess formed in the base structure. The method may further include placing a magnet within the recess, wherein the recess includes at least a portion of a spring, the spring affixed to the base structure and extending into the recess, the placing including placing the magnet on a side of the electromagnetic actuator, between the spring and the side of the electromagnetic actuator, the spring pressing the magnet against the side of the electromagnetic actuator and maintaining a position of the magnet in response to the placing the magnet within the recess.

25 Claims, 7 Drawing Sheets

(51) Int. Cl.
  *B29C 65/48* (2006.01)
  *B29C 65/14* (2006.01)
  *B29L 31/34* (2006.01)

(52) U.S. Cl.
  CPC ..... *B29L 2031/34* (2013.01); *B81B 2201/038* (2013.01); *B81B 2201/042* (2013.01); *B81B 2203/0163* (2013.01); *B81B 2203/051* (2013.01); *B81C 2203/032* (2013.01)

(56) References Cited

U.S. PATENT DOCUMENTS

| | | | |
|---|---|---|---|
| 9,829,672 B2* | 11/2017 | Oh | G02B 7/04 |
| 2005/0002085 A1* | 1/2005 | Matsui | G02B 26/085 |
| | | | 359/291 |
| 2007/0176719 A1 | 8/2007 | Levitan et al. | |
| 2010/0304517 A1 | 12/2010 | Jeong et al. | |
| 2015/0241479 A1 | 8/2015 | Koury, Jr. et al. | |
| 2016/0154233 A1 | 6/2016 | Takimoto et al. | |
| 2016/0233793 A1* | 8/2016 | Henderson | H04N 5/2251 |
| 2017/0118408 A1* | 4/2017 | Gregory | H04N 5/23287 |

* cited by examiner

MICROELECTROMECHANICAL SYSTEM WITH SPRING FOR MAGNET PLACEMENT

TECHNICAL FIELD

The present disclosure relates to the field of electronic circuits. More particularly, the present disclosure relates to placement of magnets within a microelectromechanical system device.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

For microelectromechanical system (MEMS) devices, it is desirable to affix multiple magnets close to an electromagnetic actuator to minimize an amount of current for actuating the electromagnetic actuator. As the magnets are positioned near the electromagnetic actuator, the magnets may repel and/or attract the other magnets causing the magnets to move from the positioned locations and often resulting in the magnets being moved away from the electromagnetic actuator. Legacy procedures of producing a legacy MEMS device involved placing a single magnet at a time and curing an epoxy to affix the single magnet in position. This legacy procedure was repeated for each magnet to be placed in the MEMS device, resulting in a relatively long duration for positioning and curing multiple magnets within the MEMS device.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
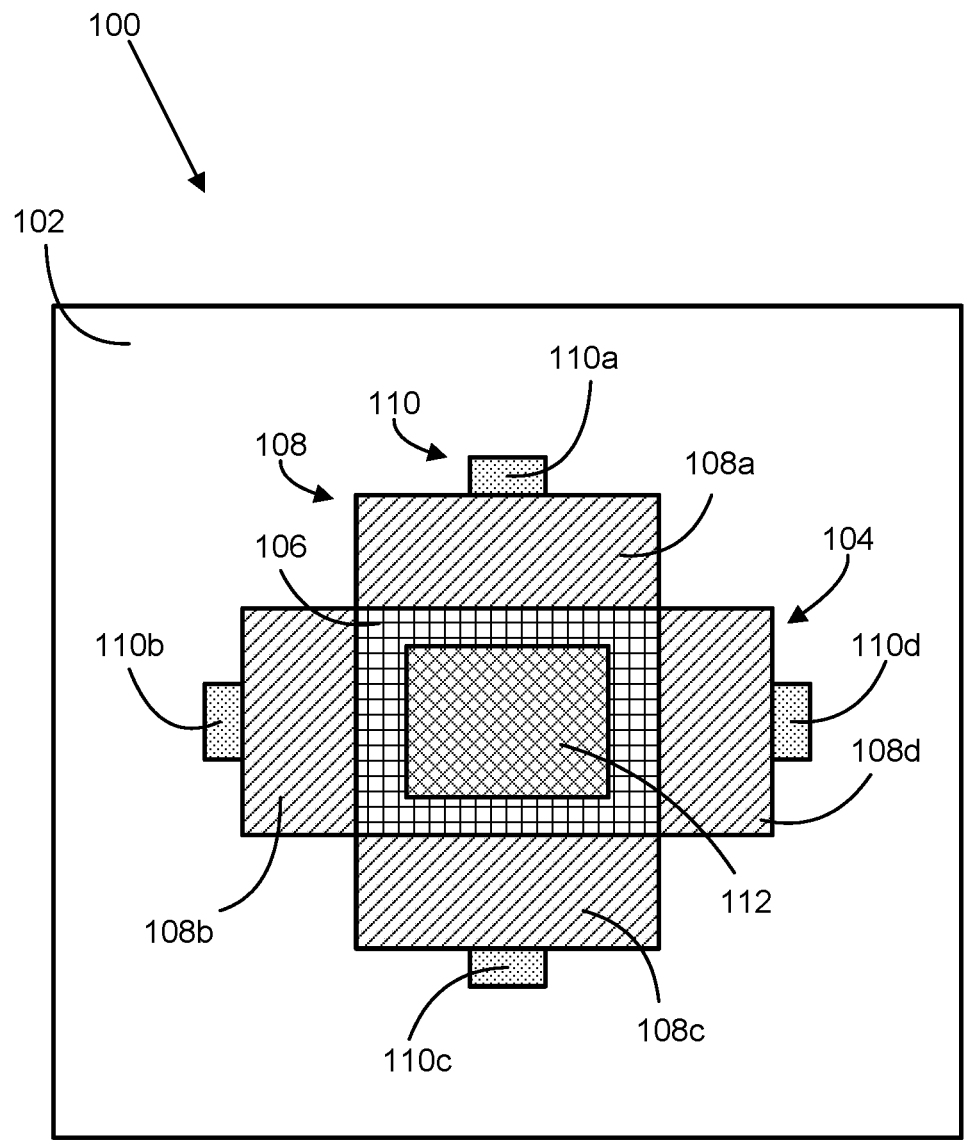
FIG. 1 illustrates a top view of an example microelectromechanical system (MEMS), according to various embodiments.

Apparatuses, systems, and methods associated with placement of magnets within a microelectromechanical system device are disclosed herein. In embodiments, a method of affixing at least one magnet in a microelectromechanical system, may include affixing an electromagnetic actuator to a base structure of the microelectromechanical system, the affixing including affixing the electromagnetic actuator within a recess formed in the base structure. The method may further include placing a magnet within the recess, wherein the recess includes at least a portion of a spring, the spring affixed to the base structure and extending into the recess, the placing including placing the magnet on a side of the electromagnetic actuator, between the spring and the side of the electromagnetic actuator, the spring pressing the magnet against the side of the electromagnetic actuator and maintaining a position of the magnet in response to the placing the magnet within the recess.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates a top view of an example microelectromechanical system (MEMS) 100, according to various embodiments. The MEMS 100 may be included in a MEMS device. The MEMS device may be a semiconductor device for use in a computer system. The MEMS device may be included in multiple different systems, such computer devices, inkjet printers, accelerometers, gyroscopes, game controllers, personal media players, phones, cell phones, digital cameras, microphones, pressure sensors, displays, optical switching technology systems, transducers.

The MEMS 100 may include a base structure 102. The base structure 102 may be formed of a magnetic material and may be a cast part. The base structure 102 may be formed of iron, silicon, polymers, gold, nickel, aluminum, copper, chromium, titanium, tungsten, platinum, silver, ceramics, alloys thereof, or some combination thereof.

A recess 104 may be formed in the base structure 102. The recess 104 may be formed in a surface of the base structure 102. The recess 104 may be formed as part of the casting process of the base structure 102. In some embodiments, the recess 104 may be clover-shaped with a rectangular center portion and four leaf portions extending distally from the rectangular center portion.

The MEMS 100 may include an electromagnetic actuator 106. The electromagnetic actuator 106 may be affixed to the base structure 102 within the recess 104. The electromagnetic actuator 106 may be affixed to the base structure 102 via an epoxy, an adhesive material, a fastener, a weldment/s, solder, or some combination thereof. In some embodiments, the electromagnetic actuator 106 may be affixed to the base structure 102 toward a center of the recess 104. In embodiments where the recess 104 is clover-shaped, the electromagnetic actuator 106 may be affixed within the rectangular center portion of the clover-shaped recess 104 and may, in some embodiments, fill the rectangular center portion.

The electromagnetic actuator 106 may include a mirror 112. The mirror 112 may rotate around one or more axes in response to changes in a magnetic field encompassing the electromagnetic actuator 106. In certain positions, the mirror 112 may reflect a light cast upon the mirror 112 into a receptor. The receptor may include a sensor to sense the reflected light, a projector to project the light on a display and/or a pixel of a display, a light-activated actuator to perform a function in response to reception of the reflected light, or some combination thereof.

The MEMS 100 may include one or more magnets 108. The magnets 108 may be positioned within the recess 104 and may abut one or more sides of the electromagnetic actuator 106. In some embodiments, the electromagnetic actuator 106 may be rectangular and one of the magnets 108 may be positioned on each side of the electromagnetic actuator 106, with a total of four magnets 108 (including magnet 108a, magnet 108b, magnet 108c, and magnet 108d) encompassing the electromagnetic actuator 106 on four sides. In some embodiments, the magnets 108 may be affixed to the base structure 102 via epoxy, an adhesive material, or some combination thereof.

The magnets 108 may be rare-earth magnets, such as neodymium magnets, samarium-cobalt magnets, Terfenol-D magnets, yttrium-cobalt magnets, or some combination thereof. The magnets 108 may generate the magnetic field encompassing the electromagnetic actuator 106. In some embodiments, the magnets 108 may generate the magnetic field in combination with base structure 102, when the base structure 102 is a magnetic material. The magnetic field generated by the magnets 108 may change as electrical current is passed through one or more of the magnets 108 and/or differing electrical potentials are applied to each of the magnets 108. The change in the magnetic field generated by the magnets 108 may cause the mirror 112 of the electromagnetic actuator 108 to rotate.

The magnets 108 may be polarized magnets with a positive pole and a negative pole. When positioned, the magnets 108 located on opposite sides of the electromagnetic actuator 106 may have opposite poles abutting the electromagnetic actuator 106. For example, the magnet 108a may be positioned with a positive pole of the magnet 108a abutting the electromagnetic actuator 106 and the magnet 108c may be positioned with a negative pole of the magnet 108c abutting the electromagnetic actuator 106. Further, for example, the magnet 108b may positioned with a positive pole of the magnet 108b abutting the electromagnetic actuator 106 and the magnet 108d may be positioned with a negative pole of the magnet 108d abutting the electromagnetic actuator 106.

The MEMS 100 may further include one or more springs 110. The springs 110 may be affixed to the base structure 102 and may extend inward into the recess 104 toward the center of the recess 104. In some embodiments, the springs 110 may be affixed to the base structure 102 outside of the recess 104 and a portion of each of the springs 110 may extend inward into the recess 104. The springs 110 may be affixed to the base structure 102 via solder, epoxy, fasteners, weldments, or some combination thereof.

Each of the magnets 108 may be located between the electromagnetic actuator 106 and a corresponding one of the springs 110. For example, magnet 108a may be located between the electromagnetic actuator 106 and the corresponding spring 110a. As each of the magnets 108 is positioned within the recess, each of the magnets 108 may contact at least a portion of the corresponding one of the springs 110 causing the corresponding spring 110 to be compressed. Based on the compression, each of the springs 110 may be urged to return to a non-compressed state and may apply a force to the corresponding one of the magnets 108, pressing the corresponding one of the magnets 108 against the electromagnetic actuator 106, in an attempt to return to the non-compressed state. For example, the force may be between five and fifty gram force.

In some embodiments where the electromagnetic actuator 106 is rectangular, the MEMS 100 may include four springs 110: spring 110a, spring 110b, spring 110c, and spring 110d. Each of the springs 110 may have a corresponding magnet 108 located between the springs 110 and the electromagnetic actuator 106: magnet 108a may be located between spring 110a and the electromagnetic actuator 106, magnet 108b may be located between spring 110b and the electromagnetic actuator 106, magnet 108c may be located between spring 110c and the electromagnetic actuator 106, and magnet 108d may be located between spring 110d and the electromagnetic actuator 106.

Figure 2:
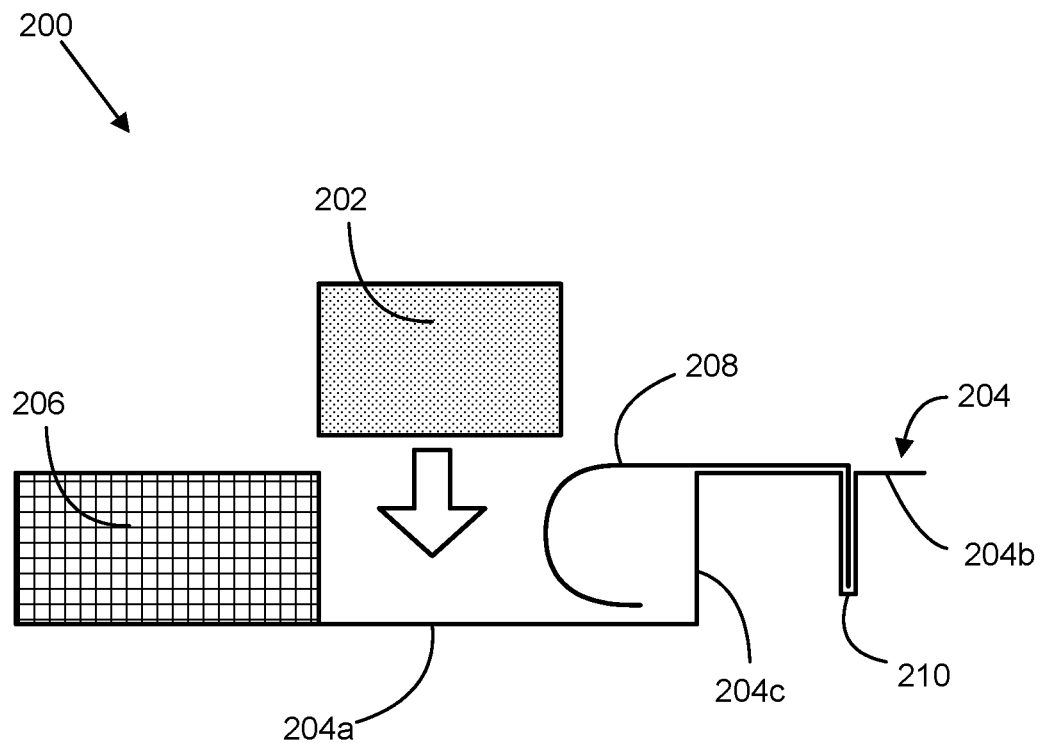
FIG. 2 illustrates an example placement of a magnet within a MEMS, according to various embodiments.

FIG. 2 illustrates an example placement of a magnet 202 within a MEMS 200, according to various embodiments. The MEMS 200 may include a base structure 204 with a recessed portion 204a and a non-recessed portion 204b. The base structure 204 may include one or more of the features of the base structure 102 (FIG. 1), including, but not limited to, being a cast part, being formed of the same materials, or some combination thereof. An electromagnetic actuator 206 may be affixed to the base structure 204 within the recessed portion 204a. The electromagnetic actuator 206 may include one or more of the features of the electromagnetic actuator 106 (FIG. 1), including, but not limited to, having the mirror 112 and having a rectangular shape.

A spring 208 may be affixed to the base structure 204. The spring 208 may include one or more of the features of the springs 110 (FIG. 1), including, but not limited to, means of affixture to the base structure 204, resistance to compression, or some combination thereof. The spring 208 may be affixed to part of the non-recessed portion 204b of the base structure 204 and may extend into the recessed portion 204a of the base structure 204. A cavity 210 may be formed in the non-recessed portion 204b of the base structure 204 and the spring 208 may be affixed within the cavity 210. A portion of the spring 208 may extend into the cavity 210 and may be affixed within the cavity 210 via frictional force. Note that although space is illustrated between the walls of the cavity 210 and the portion of the spring 208 for clarity, the portion of the spring 208 may contact the walls of the cavity 210 providing the frictional force affixing the portion of the spring 208 within the cavity 210.

In some embodiments, the spring 208 may be affixed to the base structure 204 via solder, epoxy, fasteners, weldments, or some combination thereof. The spring 208 may be affixed within the cavity 210 or to the non-recessed portion 204b outside of the cavity 210. Further, in some embodiments, the cavity 210 may be omitted and the spring may be affixed to the non-recessed portion 204b. In some embodiments, the spring 208 may be affixed to the base structure 204 within the recessed portion 204a, to a transition wall 204c connecting the recessed portion 204a and the non-recessed portion 204b, or some combination thereof.

A width of the magnet 202 may be greater than the distance between the electromagnetic actuator 206 and the spring 208. Accordingly, as the magnet 202 is placed between the electromagnetic actuator 206 and the spring 208, the magnet 202 may contact the spring 208 and may cause the spring 208 to become compressed. The spring 208 may be urged to return to a non-compressed state and may press the magnet 202 against the electromagnetic actuator 206 in an attempt to return to the non-compressed state.

Figure 3:
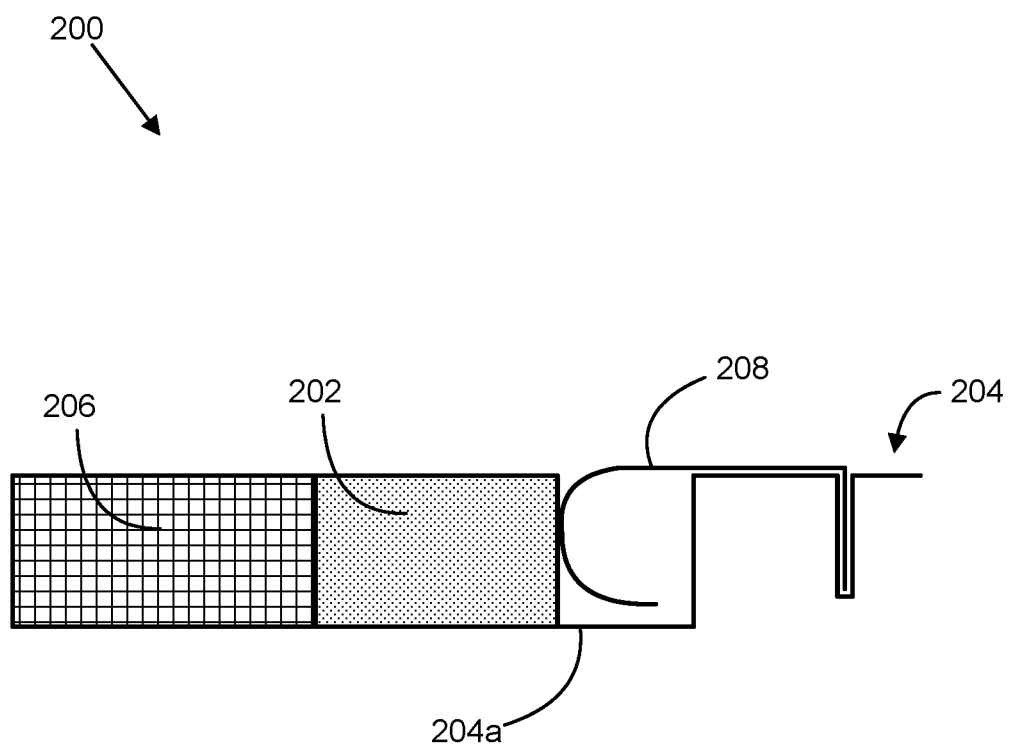
FIG. 3 illustrates the example MEMS of FIG. 2 with the magnet placed, according to various embodiments.

FIG. 3 illustrates the example MEMS 200 with the magnet 202 placed, according to various embodiments. The magnet 202 may be placed within the recessed portion 204a of the base structure 204, and may be located between the electromagnetic actuator 206 and the spring 208. The magnet 202 may abut the electromagnetic actuator 206 on a first side of the magnet 202, and may contact and compress the spring 208 on a second side of the magnet 202 opposite to the first side. In response to being compressed, the spring 208 may exert a force on the magnet 202 pressing the magnet 202 against the electromagnetic actuator 206 and maintaining the position of the magnet 202. The force exerted may be between five and fifty gram force.

In some embodiments, the magnet 202 may be affixed to the base structure 204 via an epoxy, an adhesive material, or some combination thereof. The epoxy and/or adhesive material may be located between the magnet 202 and the recessed portion 204a of the base structure 204 that abuts the magnet 202.

Figure 4:
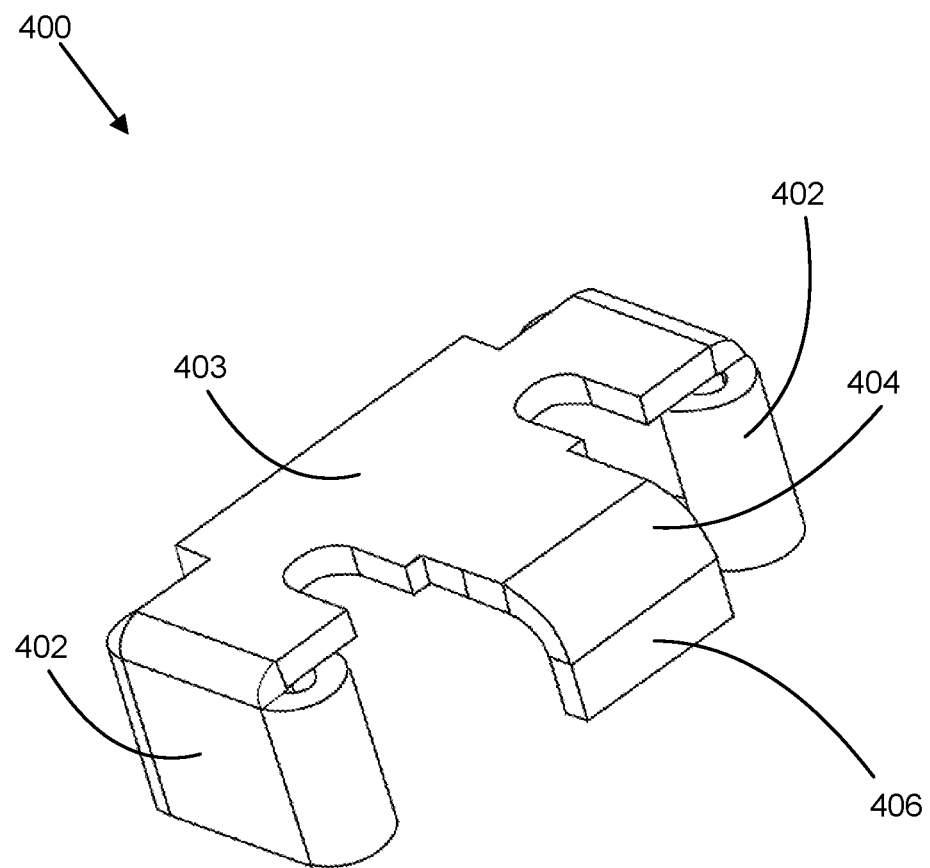
FIG. 4 illustrates an example spring, according to various embodiments.

FIG. 4 illustrates an example spring 400, according to various embodiments. The spring 400 may be utilized as one or more of the springs 110 (FIG. 1), and/or as the spring 208 (FIG. 2). Further, the spring 400 may be utilized in a MEMS, such as the MEMS 100 (FIG. 1) and the MEMS 200 (FIG. 2). The spring 400 may be formed from a metal (such as steel, bronze, titanium, or some combination thereof), plastic, or some combination thereof.

The spring 400 may include side portions 402, a main body 403, and a front portion 404. The side portions 402 may be affixed to a base structure, such as base structure 102 and the base structure 204. The side portions 402 may extend into a cavity, such as the cavity 210 (FIG. 2), and may be affixed within the cavity by frictional force. In other embodiments, the side portions 402 may be affixed to the base structure by one or more of the means of affixation described throughout this disclosure, including solder, epoxy, fasteners, weldments, or some combination thereof. Further, the spring may be affixed to a non-recessed portion (such as the non-recessed portion 204b (FIG. 2)), a recessed portion (such as the recessed portion 204a (FIG. 2)), a transition wall (such as the transition wall 204c (FIG. 2)), or some combination thereof of the base structure.

The front portion 404 of the spring 400 may extend into a recessed portion (such as the recessed portion 204a (FIG. 2)) of the base structure. The front portion 404 may include a contact bump 406 for contact with a magnet (such as the magnets 108 (FIG. 1) and/or the magnet 202 (FIG. 2)) of the MEMS, in accordance with the contact between magnets and corresponding springs described throughout this disclosure. As the magnet contacts the contact bump 406, the front portion 404 of the spring 400 may be compressed toward the side portions 402 of the spring 400. The spring 400 may be urged to return to the non-compressed state and, accordingly, the contact bump 406 may apply a force to the magnet as the front portion 404 is urged to return to a non-compressed distance from the side portions 402. The force applied by the spring 400 may be between five and fifty gram force.

The main body 403 may extend among the side portions 402 and the front portion 404, connecting the side portions 402 with the front portion 404. When the side portions 402 are affixed to the base structure, the main body 403 may extend across a surface of the base structure. In some embodiments, the main body 403 may extend from the non-recessed portion of the base structure, where the side portions 402 are affixed, into the recessed potion of the base structure, into which the front portion 404 extends. In some embodiments, the main body 403 may flex as the front portion 404 is compressed toward the side portions 402.

While the spring 400 may be utilized in the MEMS (such as the MEMS 100 (FIG. 1) and the MEMS 200 (FIG. 2), it is to be understood that the MEMS are not limited to utilizing spring 400. The MEMS may utilize any type of compression spring that is urged to return to a non-compressed state in response to being compressed. For example, the MEMS may utilize a wire spring (such as a helical spring, a coil spring, and/or a conical spring), a leaf spring, a formed spring (such as the spring 400), or some combination thereof.

Figure 5:
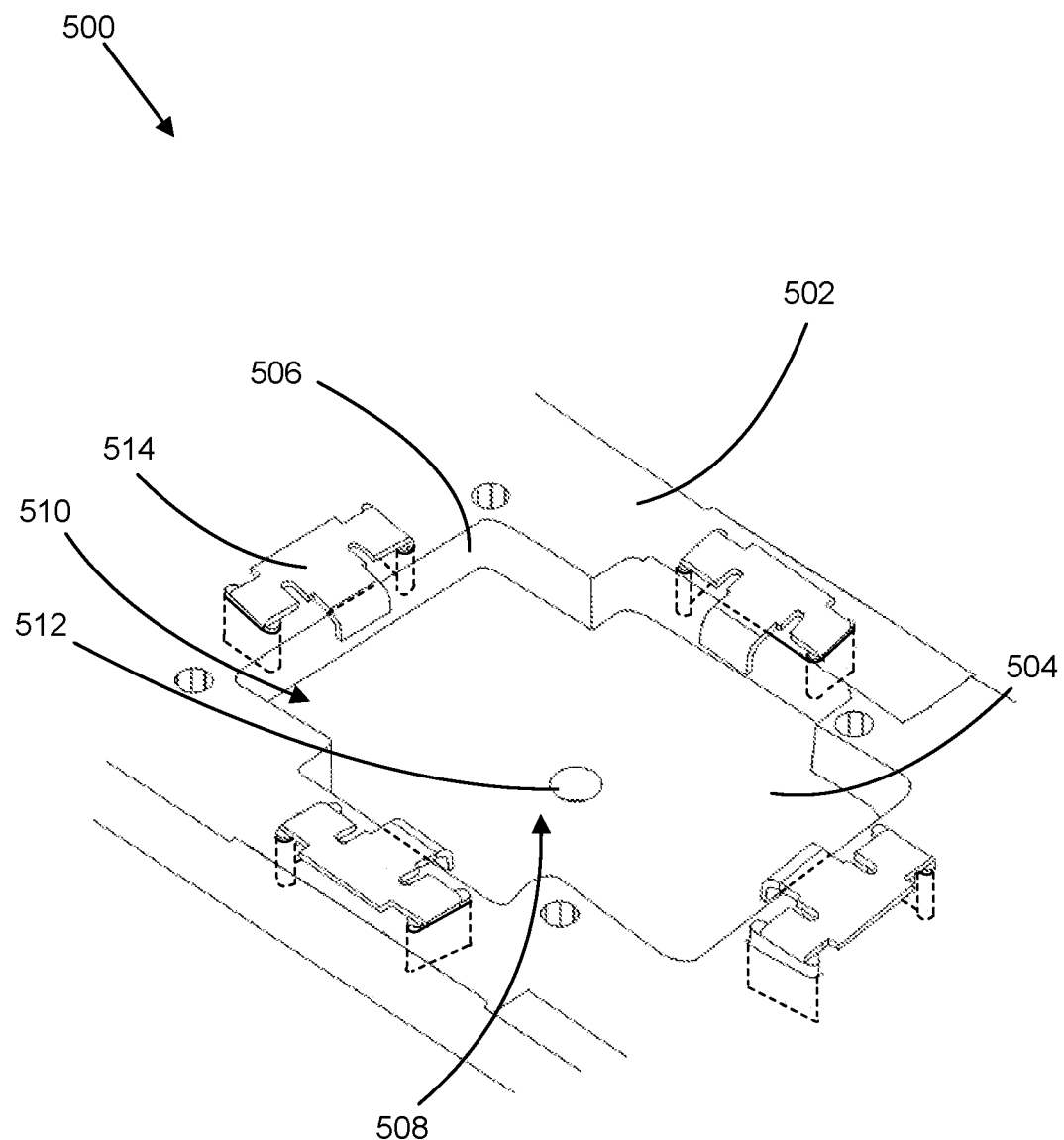
FIG. 5 illustrates an example base structure for a MEMS, according to various embodiments.

FIG. 5 illustrates an example base structure 500 for a MEMS, according to various embodiments. The base structure 500 may include one or more of the features of the base structure 102 (FIG. 1), the base structure 204 (FIG. 2), or some combination thereof, including the material from which the base structure 500 is formed, the cavity 210 (FIG. 2), the recessed portion 204a (FIG. 2), the non-recessed portion 204b (FIG. 2), the transition wall 204c (FIG. 2), or some combination thereof.

The base structure 500 may include a non-recessed portion 502 that encompasses a recessed portion 504. A transition wall 506 may extend between the non-recessed portion 502 and the recessed portion 504, and may encompass the recessed portion 504.

The recessed portion 504 may be clover-shaped. The recessed portion 504 may include a center portion 508, which may be rectangular in shape, and four leaf portions 510 abutting and extending distally from the center portion 508 on the four sides of the center portion 508. In embodiments where the recessed portion 504 is clover-shaped, the MEMS may have an electromagnetic actuator (such as the electromagnetic actuator 106 (FIG. 1) and/or the electromagnetic actuator 206 (FIG. 2)) affixed to the base structure 500 within the center portion 508 of the recessed portion 504. Further, one or more magnets may be affixed within the leaf portions 510, with some embodiments including four magnets with one magnet affixed within each of the four leaf portions 510. In other embodiments, the recessed portion 504 may be different shaped, such as rectangular-shaped, circular-shaped, diamond-shaped, cross-shaped, or some combination thereof.

In some embodiments, the base structure 500 may include an aperture 512 formed within the recessed portion 504. The aperture 512 may be formed in a center of the recessed portion 504 and may extend through the base structure 500. For the MEMS, a fastener may extend through the aperture 512 and affix the electromagnetic actuator to the base structure 500. In some embodiments, the aperture 512 may be omitted and the electromagnetic actuator may be affixed to the base structure 500 by other means, such as epoxy, adhesive material, a weldment/s, solder, or some combination thereof.

One or more springs 514 may be affixed to the base structure 500 and may extend into the recessed portion 504 of the base structure 500. The springs 514 may include one or more of the features of the springs 110 (FIG. 1), the spring 208 (FIG. 2), the spring 400 (FIG. 4), or some combination thereof. Each of the springs 514 may be affixed to the non-recessed portion 502 near a corresponding one of the leaf portions 510 and may extend into the corresponding leaf portion 510. In some embodiments, the springs 514 may be affixed to the recessed portion 504, the non-recessed portion 502, the transition wall 506, or some combination thereof.

Figure 6:
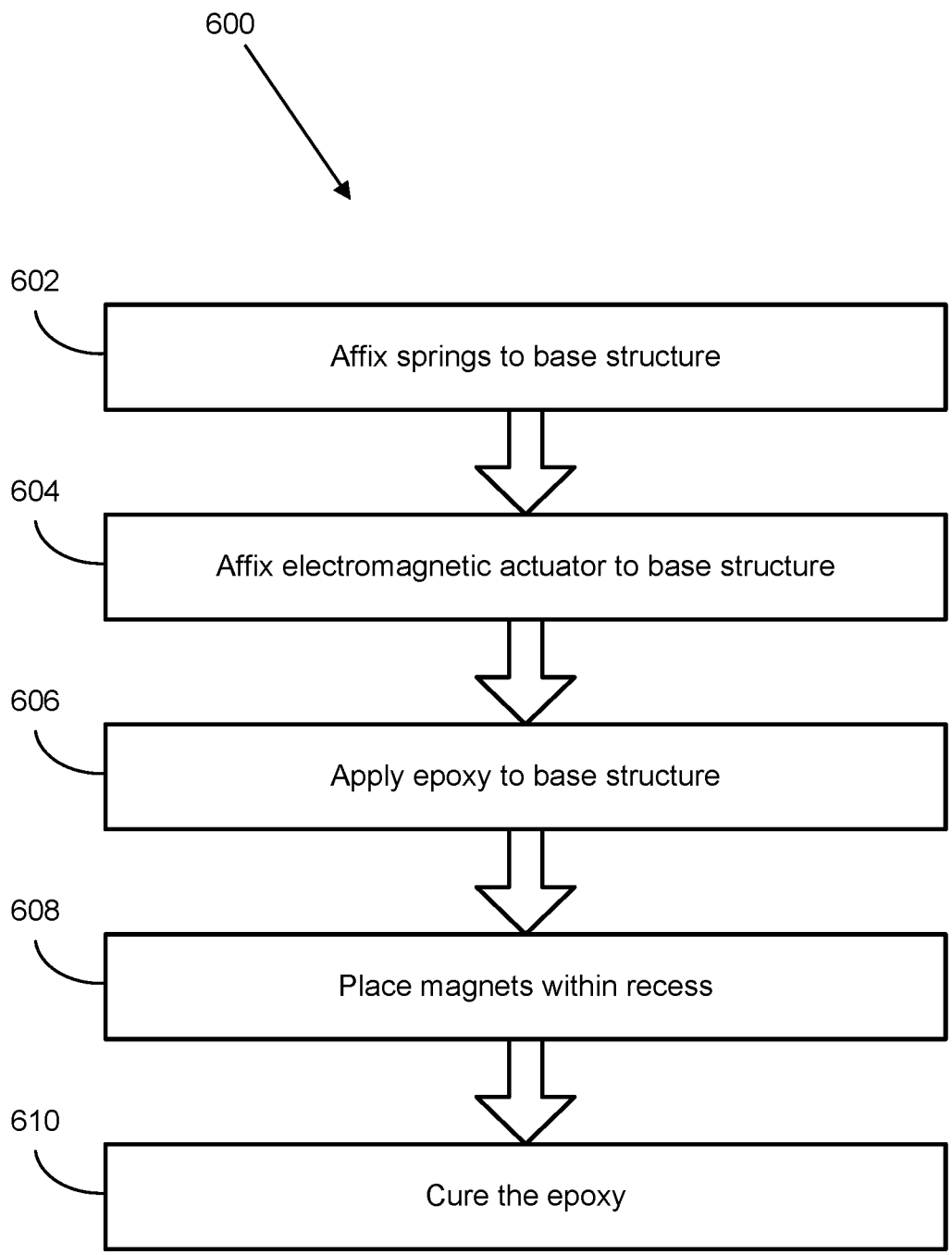
FIG. 6 illustrates an example procedure of producing a MEMS, according to various embodiments.

FIG. 6 illustrates an example procedure 600 of producing a MEMS, according to various embodiments. In 602, one or more springs may be affixed to a base structure. The springs may include one or more of the features of the springs 110 (FIG. 1), the spring 208 (FIG. 2), the spring 400 (FIG. 4), the springs 514 (FIG. 5), or some combination thereof. The base structure may include one or more of the features of the base structure 102 (FIG. 1), the base structure 204 (FIG. 2), the base structure 500 (FIG. 5), or some combination thereof. Further, the springs may be affixed to the base structure by any means of affixing springs to a base structure described throughout this disclosure. The springs may be affixed to the base structure with the spring extending into a recess on a corresponding side of an electromagnetic actuator of the MEMS.

In some embodiments, 602 may be omitted. For example, a pre-fabricated base structure may be provided with the springs included in the base structure and/or affixed to the base structure. In this example, it may be redundant for the procedure 600 to include 602 and, accordingly, 602 may be omitted.

In 604, an electromagnetic actuator may be affixed to the base structure. The electromagnetic actuator may include one or more of the features of the electromagnetic actuator 106 (FIG. 1), the electromagnetic actuator 206 (FIG. 2), or some combination thereof. Further, the electromagnetic actuator may be affixed to the base structure by any of the means of affixing an electromagnetic actuator to a base structure described throughout this disclosure.

Affixing the electromagnetic actuator to the base structure may include positioning the electromagnetic actuator within a center of a recess of the base structure. The electromagnetic actuator may be positioned on an epoxy and the epoxy may be cured to affix the electromagnetic actuator to the base structure. In some embodiments, the electromagnetic actuator may be affixed to the base structure by any means of affixture described throughout this disclosure, including an adhesive material, a fastener, a weldment/s, solder, or some combination thereof.

In some embodiments, 604 may be omitted. For example, the base structure may be pre-fabricated with the electromagnetic actuator already affixed to the base structure. In this example, it may be redundant for the procedure 600 to include 604 and, accordingly, 604 may be omitted.

In 606, epoxy may be applied to the base structure. The epoxy may be applied to the base structure within the recessed portion of the base structure at the positions where the magnets are to be affixed. In some embodiments, adhesive material may be applied to the base structure within the recessed portion where the magnets are to be affixed. Further, in some embodiments, 606 may be omitted.

In 608, one or more magnets may be placed within the recessed portion of the base structure. The magnets may be placed between the electromagnetic actuator and a corresponding spring, as described throughout this disclosure. Placing one of the magnets may include having a side of the magnet contacting the corresponding spring and causing the corresponding spring to be compressed as the magnet is placed. When the magnet has been placed and release, the spring may be urged to return to a non-compressed state and may apply a force to the magnet, pressing the magnet against the electromagnetic actuator and maintaining a position of the magnet, in response to being urged to return to the non-compressed state.

In embodiments where the magnets are polarized magnets with a positive pole and a negative pole, the one or more magnets may be placed based on the polarization. Magnets placed on opposite sides of the electromagnetic actuator may have opposite poles abutting the electromagnetic actuator. For example, the magnet on one side may be positioned with a positive pole of the magnet abutting the electromagnetic actuator and the magnet on the opposite side of the electromagnetic actuator may be positioned with a negative pole of the magnet abutting the electromagnetic actuator.

In embodiments where epoxy and/or adhesive material are applied to the base structure in 606, the one or more magnets may be placed on the epoxy and/or adhesive material. In embodiments where 606 was omitted, the one or more magnets may be placed directly in contact with the base structure within the recessed portion.

In 610, the epoxy applied to the base in 606 may be cured. Curing the epoxy may include applying heat, light (including ultraviolet light), chemicals, pressure, or some combination thereof, to the epoxy and/or the magnet/s located on the epoxy. The magnet/s located on the epoxy may become affixed to the base structure in response to the epoxy being cured.

In some embodiments where the adhesive material is applied to the base structure rather than the epoxy, 610 may include applying pressure to the magnet to engage the magnet with the adhesive material. The magnet may become affixed to the base structure in response to the magnet being engaged with the adhesive material via the application of pressure. Further, in some embodiments, the adhesive material may be cured, in addition to or in lieu of the pressure applied to the magnet, via application of heat, light (including ultraviolet light), chemicals, pressure, or some combination thereof to the adhesive material and/or the magnet.

In some embodiments, 610 may include welding, soldering, and/or utilizing one or more fasteners to affix the magnet to the base structure. This may be performed in addition to or in lieu of the epoxy and/or adhesive material being applied to the base structure.

Further, in some embodiments where 606 was omitted, 610 may be omitted. In these embodiments, the force applied by the spring to the magnet may affix the magnet to the base structure and maintain the position of the magnet.

Although procedure 600 is described in a certain order above, it is to be understood that features of the procedure 600 may be transposed or omitted. For example, affixing the electromagnetic actuator to the base structure of 604 may be performed prior to affixing the springs to the base structure of 602 in some embodiments.

Figure 7:
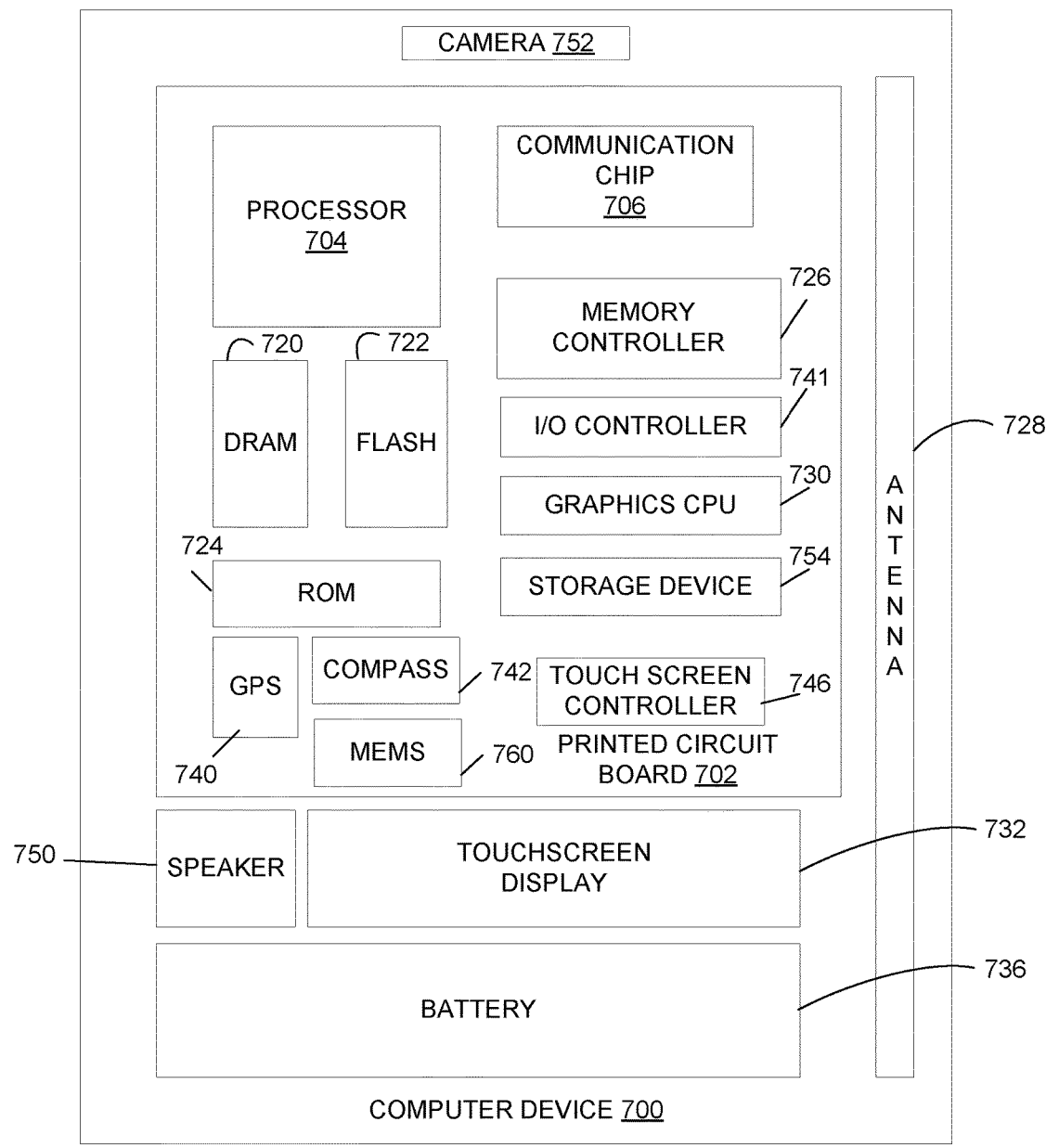
FIG. 7 illustrates an example computer device that may employ the apparatuses and/or methods described herein.

FIG. 7 illustrates an example computer device 700 that may employ the apparatuses and/or methods described herein (e.g., the MEMS 100, the MEMS 200, the base structure 500, and/or the procedure 600), in accordance with various embodiments. As shown, computer device 700 may include a number of components, such as one or more processor(s) 704 (one shown) and at least one communication chip 706.

In various embodiments, the one or more processor(s) 704 each may include one or more processor cores. In various embodiments, the at least one communication chip 706 may be physically and electrically coupled to the one or more processor(s) 704. In further implementations, the communication chip 706 may be part of the one or more processor(s) 704. In various embodiments, computer device 700 may include printed circuit board (PCB) 702. For these embodiments, the one or more processor(s) 704 and communication chip 706 may be disposed thereon. In alternate embodiments, the various components may be coupled without the employment of PCB 702.

Depending on its applications, computer device 700 may include other components that may or may not be physically and electrically coupled to the PCB 702. These other components include, but are not limited to, memory controller 726, volatile memory (e.g., dynamic random access memory (DRAM) 720), non-volatile memory such as read only memory (ROM) 724, flash memory 722, storage device 754 (e.g., a hard-disk drive (HDD)), an I/O controller 741, a digital signal processor (not shown), a crypto processor (not shown), a graphics processor 730, one or more antenna 728, a display (not shown), a touch screen display 732, a touch screen controller 746, a battery 736, an audio codec (not shown), a video codec (not shown), a global positioning system (GPS) device 740, a compass 742, an accelerometer (not shown), a gyroscope (not shown), a speaker 750, a camera 752, and a mass storage device (such as hard disk drive, a solid state drive, compact disk (CD), digital versatile disk (DVD)) (not shown), and so forth. Further, a MEMS and/or MEMS device 760 may be electrically coupled to the PCB 702. The MEMS and/or MEMS device 760 may include one or more of the features of the MEMS 100 (FIG. 1) and/or the MEMS 200 (FIG. 2).

In some embodiments, the one or more processor(s) 704, flash memory 722, and/or storage device 754 may include associated firmware (not shown) storing programming instructions configured to enable computer device 700, in response to execution of the programming instructions by one or more processor(s) 704, to practice all or selected aspects of the methods described herein. In various embodiments, these aspects may additionally or alternatively be implemented using hardware separate from the one or more processor(s) 704, flash memory 722, or storage device 754.

The communication chips 706 may enable wired and/or wireless communications for the transfer of data to and from the computer device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 700 may include a plurality of communication chips 706. For instance, a first communication chip 706 may be dedicated to shorter range wireless communications such as Wi-Fi and Bluetooth, and a second communication chip 706 may be dedicated to longer range wireless communications such as GPS, EDGE, GPRS, CDMA, WiMAX, LTE, Ev-DO, and others.

In various implementations, the computer device 700 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 700 may be any other electronic device that processes data.

Example 1 may include a method of affixing at least one magnet in a microelectromechanical system, comprising affixing an electromagnetic actuator to a base structure of the microelectromechanical system, the affixing including affixing the electromagnetic actuator within a recess formed in the base structure, and placing a magnet within the recess, wherein the recess includes at least a portion of a spring, the spring affixed to the base structure and extending into the recess, the placing including placing the magnet on a side of the electromagnetic actuator, between the spring and the side of the electromagnetic actuator, the spring pressing the magnet against the side of the electromagnetic actuator and maintaining a position of the magnet in response to the placing the magnet within the recess.

Example 2 may include the method of example 1, wherein the magnet is a first magnet, wherein the spring is a first spring, wherein the side is a first side, and the method further comprising placing a second magnet within the recess on a second side of the electromagnetic actuator, wherein the recess includes at least a portion of a second spring, the second spring affixed to the base structure and extending into the recess, wherein placing the second magnet includes placing the second magnet between the second spring and the second side of the electromagnetic actuator, the second spring pressing the second magnet against the second side of the electromagnetic actuator and maintaining a position of the second magnet.

Example 3 may include the method of example 2, further comprising applying epoxy to the base structure within the recess, wherein the first magnet and the second magnet are placed on the epoxy, and curing the epoxy with the first magnet and the second magnet placed on the epoxy.

Example 4 may include the method of example 3, wherein curing the epoxy includes applying ultraviolet light to the epoxy.

Example 5 may include the method of any of the examples 2-4, further comprising affixing the first spring to the base structure, the affixing the first spring including affixing the first spring with the first spring extending into the recess on the first side of the electromagnetic actuator, and affixing the second spring to the base structure, the affixing the second spring including affixing the second spring with the second spring extending into the recess on the second side of electromagnetic actuator.

Example 6 may include the method of any of the examples 2-4, wherein the first side of the electromagnetic actuator is opposite to the second side of the electromagnetic actuator, wherein placing the first magnet within the recess includes placing the first magnet within the recess with a positive pole of the first magnet abutting the first side of the electromagnetic actuator, and wherein placing the second magnet within the recess includes placing the second magnet within the recess with a negative pole of the second magnet abutting the second side of the electromagnetic actuator.

Example 7 may include the method of any of the examples 2-4, further comprising placing a third magnet within the recess on a third side of the electromagnetic actuator, the placing including placing the third magnet between a third spring and the third side of the electromagnetic actuator, the third spring pressing the third magnet against the third side of the electromagnetic actuator and maintaining a position of the third magnet in response to placing the third magnet within the recess, and placing a fourth magnet within the recess on a fourth side of the electromagnetic actuator, the placing including placing the fourth magnet between a fourth spring and the fourth side of the electromagnetic actuator, the fourth spring pressing the fourth magnet against the fourth side of the electromagnetic actuator and maintaining a position of the fourth magnet in response to placing the fourth magnet within the recess.

Example 8 may include the method of example 7, wherein the third side of the electromagnetic actuator is opposite to the fourth side of the electromagnetic actuator, wherein placing the third magnet within the recess includes placing the third magnet within the recess with a positive pole of the third magnet abutting the third side of the electromagnetic actuator, and wherein placing the fourth magnet within the recess includes placing the fourth magnet within the recess with a negative pole of the fourth magnet abutting the fourth side of the electromagnetic actuator.

Example 9 may include the method of example 7, wherein the third magnet and the fourth magnet are placed on the epoxy, and wherein the epoxy is cured with the third magnet and the fourth magnet placed on the epoxy.

Example 10 may include the method of example 7, further comprising affixing the third spring to the base structure, the affixing the third spring including affixing the third spring with the third spring extending into the recess on the third side of the electromagnetic actuator, and affixing the fourth spring to the base structure, the affixing the fourth spring including affixing the fourth spring with the fourth spring extending into the recess on the fourth side of the electromagnetic actuator.

Example 11 may include the method of example 7, wherein the electromagnetic actuator has four sides, and wherein the electromagnetic actuator is encompassed on the four sides by the first magnet, the second magnet, the third magnet, and the fourth magnet.

Example 12 may include a microelectromechanical system, comprising a base structure with a recess formed in the base structure, an electromagnetic actuator affixed to the base structure within the recess, a magnet located within the recess on a side of the electromagnetic actuator, and a spring affixed to the base structure, wherein the spring extends into the recess on the side of the electromagnetic actuator, the magnet located between the spring and the electromagnetic actuator, and wherein the spring is to press the first magnet against the side of the electromagnetic actuator.

Example 13 may include the microelectromechanical system of example 12, wherein the magnet is a first magnet, wherein the side of the electromagnetic actuator is a first side of the electromagnetic actuator, wherein the spring is a first spring, and wherein the microelectromechanical system further comprises a second magnet located within the recess on a second side of the electromagnetic actuator, and a second spring affixed to the base structure, wherein the second spring extends into the recess on the second side of the electromagnetic actuator, the second magnet located between the second spring and the electromagnetic actuator, and wherein the second spring is to press the second magnet against the second side of the electromagnetic actuator.

Example 14 may include the microelectromechanical system of example 13, wherein the first magnet is affixed to the base structure via epoxy, wherein the first magnet abuts the first side of the electromagnetic actuator, wherein the second magnet is affixed to the base structure via epoxy, and wherein the second magnet abuts the second side of the electromagnetic actuator.

Example 15 may include the microelectromechanical system of any of the examples 13 and 14, wherein the first spring is affixed to the base structure at a first portion of the base structure located outside of the recess formed in the base structure, and wherein the second spring is affixed to the base structure at a second portion of the base structure located outside of the recess formed in the base structure.

Example 16 may include the microelectromechanical system of example 15, wherein a first cavity is formed in the first portion of the base structure, wherein a portion of the first spring extends into the first cavity, wherein the portion of the first spring is affixed within the first cavity via frictional force, wherein a second cavity is formed in the second portion of the base structure, wherein a portion of the second spring extends into the second cavity, and wherein the portion of the second spring is affixed within the second cavity via frictional force.

Example 17 may include the microelectromechanical system of example 15, wherein the first spring and the second spring are affixed to the base structure via solder, epoxy, fasteners, or weldments.

Example 18 may include the microelectromechanical system of any of the examples 13 and 14, wherein the electromagnetic actuator includes a mirror, wherein the mirror is to rotate in response to changes in a magnetic field generated by the first magnet and the second magnet.

Example 19 may include the microelectromechanical system of any of the examples 13 and 14, wherein the first magnet and the second magnet comprise neodymium magnets.

Example 20 may include the microelectromechanical system of any of the examples 13 and 14, wherein the recess formed in the base structure is a clover-shaped recess, and wherein the electromagnetic actuator is located within a center portion of the clover-shaped recess, the first magnet is located within a first leaf portion of the clover-shaped recess, and the second magnet is located within a second leaf portion of the clover-shaped recess.

Example 21 may include the microelectromechanical system of any of the examples 13 and 14, wherein the first side of the electromagnetic actuator is opposite to the second side of the electromagnetic actuator, wherein a positive pole of the first magnet abuts the first side of the electromagnetic actuator, and wherein a negative pole of the second magnet abuts the second side of the electromagnetic actuator.

Example 22 may include the microelectromechanical system of any of the examples 12-14, wherein the base structure is formed of a magnetic material.

Example 23 may include the microelectromechanical system of any of the examples 13 and 14, further comprising a third magnet located within the recess on a third side of the electromagnetic actuator, a fourth magnet located within the recess on a fourth side of the electromagnetic actuator, a third spring affixed to the base structure, wherein the third spring extends into the recess on the third side of the electromagnetic actuator, the third magnet located between the third spring and the electromagnetic actuator, and wherein the third spring is to press the third magnet against the third side of the electromagnetic actuator, and a fourth spring affixed to the base structure, wherein the fourth spring extends into the recess on the fourth side of the electromagnetic actuator, the fourth magnet located between the fourth spring and the electromagnetic actuator, and wherein the fourth spring is to press the fourth magnet against the fourth side of the electromagnetic actuator.

Example 24 may include the microelectromechanical system of example 23, wherein the third magnet is affixed to the based structure via epoxy, wherein the third magnet abuts the third side of the electromagnetic actuator, wherein the fourth magnet is affixed to the base structure via epoxy, and wherein the fourth magnet abuts the fourth side of the electromagnetic actuator.

Example 25 may include the microelectromechanical system of example 23, wherein the third spring is affixed to the base structure at a third portion of the base structure located outside of the recess formed in the base structure, and wherein the fourth spring is affixed to the base structure at a fourth portion of the base structure located outside of the recess formed in the base structure.

Example 26 may include the microelectromechanical system of example 25, wherein a third cavity is formed in the third portion of the base structure, wherein a portion of the third spring extends into the third cavity, wherein the portion of the third spring is affixed within the third cavity via frictional force, wherein a fourth cavity is formed in the fourth portion of the base structure, wherein a portion of the fourth spring extends into the fourth cavity, and wherein the portion of the fourth spring is affixed within the fourth cavity via frictional force.

Example 27 may include the microelectromechanical system of example 25, wherein the third spring and the fourth spring are affixed to the base structure via solder, epoxy, fasteners, or weldments.

Example 28 may include the microelectromechanical system of example 23, wherein the electromagnetic actuator includes a mirror, wherein the mirror is to rotate in response to changes in a magnetic field generated by the first magnet, the second magnet, the third magnet, and the fourth magnet.

Example 29 may include the microelectromechanical system of example 23, wherein the recess formed in the base structure is a clover-shaped recess, and wherein the electromagnetic actuator is located within a center portion of the clover-shaped recess, the first magnet is located within a first leaf portion of the clover-shaped recess, the second magnet is located within a second leaf portion of the clover-shaped recess, the third magnet is located within a third leaf portion of the clover-shaped recess, and the fourth magnet is located within a fourth leaf portion of the clover-shaped recess.

Example 30 may include the microelectromechanical system of example 23, wherein the third side of the electromagnetic actuator is opposite to the fourth side of the electromagnetic actuator, wherein a positive pole of the third magnet abuts the third side of the electromagnetic actuator, and wherein a negative pole of the fourth magnet abuts the fourth side of the electromagnetic actuator.

Example 31 may include the microelectromechanical system of example 23, wherein the electromagnetic actuator has four sides, and wherein the electromagnetic actuator is encompassed on the four sides by the first magnet, the second magnet, the third magnet, and the fourth magnet.

Example 32 may include computer system, comprising a circuit board, and a semiconductor device communicatively coupled to the circuit board, wherein the semiconductor device includes a base structure with a recess formed in the base structure, an electromagnetic actuator affixed to the base structure within the recess, wherein the electromagnetic actuator includes a mirror, wherein the mirror is to rotate in response to changes in a magnetic field that encompasses the mirror, a spring affixed to the base structure, wherein the spring extends into the recess on a side of the electromagnetic actuator, a magnet located within the recess on the side of the electromagnetic actuator, wherein the magnet is located between the spring and the electromagnetic actuator, wherein the spring is to press the magnet against the side of electromagnetic actuator, wherein the magnet generates the magnetic field that encompasses the mirror.

Example 33 may include the computer system of example 32, wherein the magnet is a first magnet, wherein the side of the electromagnetic actuator is a first side of the electromagnetic actuator, wherein the spring is a first spring, and wherein the semiconductor device further includes a second spring affixed to the base structure, wherein the second spring extends into the recess on a second side of the electromagnetic actuator, and a second magnet located within the recess on the second side of the electromagnetic actuator, wherein the second magnet is located between the second spring and the electromagnetic actuator, wherein the second spring is to press the second magnet against the second side of the electromagnetic actuator, wherein the second magnet further generates the magnetic field that encompasses the mirror.

Example 34 may include the computer system of example 33, wherein the first spring is affixed to the base structure at a first portion of the base structure located outside of the recess formed in the base structure, and wherein the second spring is affixed to the base structure at a second portion of the base structure located outside of the recess formed in the base structure.

Example 35 may include the computer system of example 34, wherein a first cavity is formed in the first portion of the base structure, wherein a portion of the first spring extends into the first cavity, wherein the portion of the first spring is affixed within the first cavity via frictional force, wherein a second cavity is formed in the second portion of the base structure, and wherein a portion of the second spring extends into the second cavity, and wherein the portion of the second spring is affixed within the second cavity via frictional force.

Example 36 may include the computer system of any of the examples 33-35, wherein the recess formed in the base structure is a clover-shaped recess, and wherein the electromagnetic actuator is located within a center portion of the clover-shaped recess, the first magnet is located within a first leaf portion of the clover-shaped recess, and the second magnet is located within a second leaf portion of the clover-shaped recess.

Example 37 may include the computer system of any of the examples 33-35, wherein the semiconductor device further includes a third spring affixed to the base structure, wherein the third spring extends into the recess on a third side of the electromagnetic actuator, a fourth spring affixed to the base structure, wherein the fourth spring extends into the recess on a fourth side of the electromagnetic actuator, a third magnet located within the recess on a third side of the electromagnetic actuator, wherein the third magnet is located between the third spring and the electromagnetic actuator, and wherein the third spring is to press the third magnet against the third side of the electromagnetic actuator, and a fourth magnet located within the recess on a fourth side of the electromagnetic actuator, wherein the fourth magnet is located between the fourth spring and the electromagnetic actuator, and wherein the fourth spring is to press the fourth magnet against fourth side of the electromagnetic actuator.

Example 38 may include the computer system of example 37, wherein the third spring is affixed to the base structure at a third portion of the base structure located outside of the recess formed in the base structure, and wherein the fourth spring is affixed to the base structure at a fourth portion of the base structure located outside of the recess formed in the base structure.

Example 39 may include the computer system of example 38, wherein a third cavity is formed in the third portion of the base structure, wherein a portion of the third spring extends into the third cavity, wherein the portion of the third spring is affixed within the third cavity via frictional force, wherein a fourth cavity is formed in the fourth portion of the base structure, wherein a portion of the fourth spring extends into the fourth cavity, and wherein the portion of the fourth spring is affixed within the fourth cavity via frictional force.

Example 40 may include the computer system of example 37, wherein the recess formed in the base structure is a clover-shaped recess, and wherein the electromagnetic actuator is located within a center portion of the clover-shaped recess, the first magnet is located within a first leaf portion of the clover-shaped recess, the second magnet is located within a second leaf portion of the clover-shaped recess, the third magnet is located within a third leaf portion of the clover-shaped recess, and the fourth magnet is located within a fourth leaf portion of the clover-shaped recess.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A method of affixing at least one magnet in a microelectromechanical system, comprising:
    affixing an electromagnetic actuator to a base structure of the microelectromechanical system, the affixing including affixing the electromagnetic actuator within a recess formed in the base structure; and
    placing a magnet within the recess, wherein the recess includes at least a portion of a spring, the spring affixed to the base structure and extending into the recess, the placing including placing the magnet on a side of the electromagnetic actuator, between the spring and the side of the electromagnetic actuator, the spring pressing the magnet against the side of the electromagnetic actuator and maintaining a position of the magnet in response to the placing the magnet within the recess.

2. The method of claim 1, wherein the magnet is a first magnet, wherein the spring is a first spring, wherein the side is a first side, and the method further comprising:
    placing a second magnet within the recess on a second side of the electromagnetic actuator, wherein the recess includes at least a portion of a second spring, the second spring affixed to the base structure and extending into the recess, wherein placing the second magnet includes placing the second magnet between the second spring and the second side of the electromagnetic actuator, the second spring pressing the second magnet against the second side of the electromagnetic actuator and maintaining a position of the second magnet.

3. The method of claim 2, further comprising:
    applying epoxy to the base structure within the recess, wherein the first magnet and the second magnet are placed on the epoxy; and
    curing the epoxy with the first magnet and the second magnet placed on the epoxy.

4. The method of claim 3, wherein curing the epoxy includes applying ultraviolet light to the epoxy.

5. The method of claim 2, further comprising:
    affixing the first spring to the base structure, the affixing the first spring including affixing the first spring with the first spring extending into the recess on the first side of the electromagnetic actuator; and
    affixing the second spring to the base structure, the affixing the second spring including affixing the second spring with the second spring extending into the recess on the second side of electromagnetic actuator.

6. The method of claim 2, wherein the first side of the electromagnetic actuator is opposite to the second side of the electromagnetic actuator, wherein placing the first magnet within the recess includes placing the first magnet within the recess with a positive pole of the first magnet abutting the first side of the electromagnetic actuator, and wherein placing the second magnet within the recess includes placing the second magnet within the recess with a negative pole of the second magnet abutting the second side of the electromagnetic actuator.

7. The method of claim 2, further comprising:
    placing a third magnet within the recess on a third side of the electromagnetic actuator, the placing including placing the third magnet between a third spring and the third side of the electromagnetic actuator, the third spring pressing the third magnet against the third side of the electromagnetic actuator and maintaining a position of the third magnet in response to placing the third magnet within the recess; and
    placing a fourth magnet within the recess on a fourth side of the electromagnetic actuator, the placing including placing the fourth magnet between a fourth spring and the fourth side of the electromagnetic actuator, the fourth spring pressing the fourth magnet against the fourth side of the electromagnetic actuator and maintaining a position of the fourth magnet in response to placing the fourth magnet within the recess.

8. The method of claim 7, wherein the third side of the electromagnetic actuator is opposite to the fourth side of the electromagnetic actuator, wherein placing the third magnet within the recess includes placing the third magnet within the recess with a positive pole of the third magnet abutting the third side of the electromagnetic actuator, and wherein placing the fourth magnet within the recess includes placing the fourth magnet within the recess with a negative pole of the fourth magnet abutting the fourth side of the electromagnetic actuator.

9. The method of claim 7, wherein the third magnet and the fourth magnet are placed on epoxy, and wherein the epoxy is cured with the third magnet and the fourth magnet placed on the epoxy.

10. The method of claim 7, further comprising:
affixing the third spring to the base structure, the affixing the third spring including affixing the third spring with the third spring extending into the recess on the third side of the electromagnetic actuator; and
affixing the fourth spring to the base structure, the affixing the fourth spring including affixing the fourth spring with the fourth spring extending into the recess on the fourth side of the electromagnetic actuator.

11. The method of claim 7, wherein the electromagnetic actuator has four sides, and wherein the electromagnetic actuator is encompassed on the four sides by the first magnet, the second magnet, the third magnet, and the fourth magnet.

12. A microelectromechanical system, comprising:
a base structure with a recess formed in the base structure;
an electromagnetic actuator affixed to the base structure within the recess;
a magnet located within the recess on a side of the electromagnetic actuator; and
a spring affixed to the base structure, wherein the spring extends into the recess on the side of the electromagnetic actuator, wherein the magnet is further located between the spring and the electromagnetic actuator, and wherein the spring is to press the first magnet against the side of the electromagnetic actuator.

13. The microelectromechanical system of claim 12, wherein the magnet is a first magnet, wherein the side of the electromagnetic actuator is a first side of the electromagnetic actuator, wherein the spring is a first spring, and wherein the microelectromechanical system further comprises:
a second magnet located within the recess on a second side of the electromagnetic actuator; and
a second spring affixed to the base structure, wherein the second spring extends into the recess on the second side of the electromagnetic actuator, the second magnet located between the second spring and the electromagnetic actuator, and wherein the second spring is to press the second magnet against the second side of the electromagnetic actuator.

14. The microelectromechanical system of claim 13, wherein the first magnet is affixed to the base structure via epoxy, wherein the first magnet abuts the first side of the electromagnetic actuator, wherein the second magnet is affixed to the base structure via epoxy, and wherein the second magnet abuts the second side of the electromagnetic actuator.

15. The microelectromechanical system of claim 13, wherein the electromagnetic actuator includes a mirror, wherein the mirror is to rotate in response to changes in a magnetic field generated by the first magnet and the second magnet.

16. The microelectromechanical system of claim 13, wherein the first magnet and the second magnet comprise neodymium magnets.

17. The microelectromechanical system of claim 13, wherein the recess formed in the base structure is a clover-shaped recess, and wherein the electromagnetic actuator is located within a center portion of the clover-shaped recess, the first magnet is located within a first leaf portion of the clover-shaped recess, and the second magnet is located within a second leaf portion of the clover-shaped recess.

18. The microelectromechanical system of claim 13, further comprising:
a third magnet located within the recess on a third side of the electromagnetic actuator;
a fourth magnet located within the recess on a fourth side of the electromagnetic actuator;
a third spring affixed to the base structure, wherein the third spring extends into the recess on the third side of the electromagnetic actuator, the third magnet located between the third spring and the electromagnetic actuator, and wherein the third spring is to press the third magnet against the third side of the electromagnetic actuator; and
a fourth spring affixed to the base structure, wherein the fourth spring extends into the recess on the fourth side of the electromagnetic actuator, the fourth magnet located between the fourth spring and the electromagnetic actuator, and wherein the fourth spring is to press the fourth magnet against the fourth side of the electromagnetic actuator.

19. A computer system, comprising:
a circuit board; and
a semiconductor device communicatively coupled to the circuit board, wherein the semiconductor device includes:
a base structure with a recess formed in the base structure;
an electromagnetic actuator affixed to the base structure within the recess, wherein the electromagnetic actuator includes a mirror, wherein the mirror is to rotate in response to changes in a magnetic field that encompasses the mirror;
a spring affixed to the base structure, wherein the spring extends into the recess on a side of the electromagnetic actuator; and
a magnet located within the recess on the side of the electromagnetic actuator, wherein the magnet is located between the spring and the electromagnetic actuator, wherein the spring is to press the magnet against the side of electromagnetic actuator, and wherein the magnet generates the magnetic field that encompasses the mirror.

20. The computer system of claim 19, wherein the magnet is a first magnet, wherein the side of the electromagnetic actuator is a first side of the electromagnetic actuator, wherein the spring is a first spring, and wherein the semiconductor device further includes:
a second spring affixed to the base structure, wherein the second spring extends into the recess on a second side of the electromagnetic actuator; and
a second magnet located within the recess on the second side of the electromagnetic actuator, wherein the second magnet is located between the second spring and the electromagnetic actuator, wherein the second spring is to press the second magnet against the second side of the electromagnetic actuator, wherein the second magnet further generates the magnetic field that encompasses the mirror.

21. The computer system of claim 20, wherein the first spring is affixed to the base structure at a first portion of the base structure located outside of the recess formed in the base structure, and wherein the second spring is affixed to the base structure at a second portion of the base structure located outside of the recess formed in the base structure.

22. The computer system of claim 21, wherein a first cavity is formed in the first portion of the base structure, wherein a portion of the first spring extends into the first cavity, wherein the portion of the first spring is affixed within the first cavity via frictional force, wherein a second cavity is formed in the second portion of the base structure, wherein a portion of the second spring extends into the second cavity, and wherein the portion of the second spring is affixed within the second cavity via frictional force.

23. The computer system of claim 20, wherein the semiconductor device further includes:
  a third spring affixed to the base structure, wherein the third spring extends into the recess on a third side of the electromagnetic actuator;
  a fourth spring affixed to the base structure, wherein the fourth spring extends into the recess on a fourth side of the electromagnetic actuator;
  a third magnet located within the recess on a third side of the electromagnetic actuator, wherein the third magnet is located between the third spring and the electromagnetic actuator, and wherein the third spring is to press the third magnet against the third side of the electromagnetic actuator; and
  a fourth magnet located within the recess on a fourth side of the electromagnetic actuator, wherein the fourth magnet is located between the fourth spring and the electromagnetic actuator, and wherein the fourth spring is to press the fourth magnet against the fourth side of the electromagnetic actuator.

24. The computer system of claim 23, wherein the third spring is affixed to the base structure at a third portion of the base structure located outside of the recess formed in the base structure, and wherein the fourth spring is affixed to the base structure at a fourth portion of the base structure located outside of the recess formed in the base structure.

25. The computer system of claim 23, wherein the recess formed in the base structure is a clover-shaped recess, and wherein the electromagnetic actuator is located within a center portion of the clover-shaped recess, the first magnet is located within a first leaf portion of the clover-shaped recess, the second magnet is located within a second leaf portion of the clover-shaped recess, the third magnet is located within a third leaf portion of the clover-shaped recess, and the fourth magnet is located within a fourth leaf portion of the clover-shaped recess.

\* \* \* \* \*